(12) United States Patent
Hagenmaier, Jr.

(10) Patent No.: US 9,069,019 B2
(45) Date of Patent: Jun. 30, 2015

(54) APPARATUS AND METHOD FOR MEASURING GROUND IMPEDANCE OF A CIRCUIT

(75) Inventor: Carl F. Hagenmaier, Jr., Los Altos, CA (US)

(73) Assignee: CHARGEPOINT, INC., Campbell, CA (US)

( * ) Notice: Subject to any disclaimer, the term of this patent is extended or adjusted under 35 U.S.C. 154(b) by 931 days.

(21) Appl. No.: 13/164,761

(22) Filed: Jun. 20, 2011

(65) Prior Publication Data

US 2012/0319660 A1 Dec. 20, 2012

(51) Int. Cl.
*G01R 27/02* (2006.01)
*G01R 31/12* (2006.01)
*G01R 27/18* (2006.01)

(52) U.S. Cl.
CPC .............. *G01R 27/025* (2013.01); *G01R 31/12* (2013.01); *G01R 27/18* (2013.01)

(58) Field of Classification Search
CPC ....... G01R 27/025; G01R 31/12; G01R 27/18

USPC ................... 324/509, 691–724, 606
See application file for complete search history.

(56) References Cited

U.S. PATENT DOCUMENTS

| 7,944,199 B2 * | 5/2011 | Wynne ........................ 324/126 |
| 2010/0134067 A1 * | 6/2010 | Baxter et al. .................. 320/109 |
| 2011/0298466 A1 * | 12/2011 | Hein et al. ..................... 324/508 |

* cited by examiner

*Primary Examiner* — Jermele M Hollington
*Assistant Examiner* — Farhana Hoque
(74) *Attorney, Agent, or Firm* — Nicholson, De Vos, Webster & Elliott LLP (57) ABSTRACT

A ground continuity circuit is described. In one embodiment, a first voltage of a signal associated with an electrical line input to a circuit is measured with respect to a first resistance value of the circuit. A ground continuity test signal is asserted into the circuit that causes the resistance value of the circuit to change to a second resistance value. A second voltage of the signal is measured with respect to the second resistance value. A ground impedance value of the circuit is determined as a function of the first and second measured voltages and the first and second resistance values.

15 Claims, 8 Drawing Sheets

FIG. 8

APPARATUS AND METHOD FOR MEASURING GROUND IMPEDANCE OF A CIRCUIT

FIELD

Embodiments of the invention relate to the field of circuits; and more specifically to measuring ground impedance of a circuit.

BACKGROUND

A grounded path is necessary for safe and uninterrupted operation of electrical equipment. Ground continuity refers to the grounded path being continuous and not significantly interrupted (e.g., due to high impedance). In certain types of electrical equipment, the grounding circuitry must be monitored and the absence of grounding shall cause the circuit to open. For example, electric vehicle charging stations (sometimes referred to as electric vehicle supply equipment (EVSE)) that are used to charge electric vehicles (including plug-in hybrid electric vehicles) may be required to monitor the grounding circuitry and prevent charging and/or disable charging when grounding continuity does not exist.

SUMMARY

A method and apparatus for measuring ground impedance is described. In one embodiment, a first peak voltage of a signal associated with an AC line input to a circuit is measured with respect to a resistance value of the circuit. A ground continuity test signal is asserted into the circuit that causes the resistance value of the circuit to change. A second peak voltage of the signal associated with the AC line input is measured with respect to the changed resistance value of the circuit. A ground impedance value is determined based on the ratio between the measured second peak voltage and the measured first peak voltage. In one embodiment, a ratio that is below a predetermined threshold indicates a high ground impedance.

In one embodiment, an apparatus includes a first set of one or more resistors that provide resistance to a circuit and a second set of one or more resistors connected in parallel with the first set of resistors by a switching mechanism. The second set of resistors are capable of providing resistance to the circuit when the switching mechanism is closed and not when the switching mechanism is open. The apparatus further includes a processor for determining a ground impedance value of the circuit based on a ratio between the voltage measurement of the circuit when the switching mechanism is closed and the voltage measurement of the circuit when the switching mechanism is open.

In another embodiment, an apparatus includes a first set of one or more resistors that provide resistance to a circuit, a second set of one or more resistors connected in parallel with the first set of resistors by a switching mechanism, a ratio circuit, a sample and hold circuit actionable by a switching mechanism, and a comparator. A ground continuity test signal, when asserted, causes the switching mechanism to close thereby lowering the resistance of the circuit and activate the sample and hold circuit. The sample and hold circuit senses voltage at its input and measures its maximum value. When the ground continuity test signal is disabled, the sample and hold circuit retains the maximum value of the voltage sampled. The comparator compares the input voltage reduced by the ratio circuit to the voltage retained by the sample and hold circuit. If the input voltage reduced by the ratio circuit exceeds the voltage retained by the sample and hold circuit, the comparator switches state thereby indicating a fault condition.

BRIEF DESCRIPTION OF THE DRAWINGS

The invention may best be understood by referring to the following description and accompanying drawings that are used to illustrate embodiments of the invention. In the drawings.

DESCRIPTION OF EMBODIMENTS

In the following description, numerous specific details are set forth. However, it is understood that embodiments of the invention may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

A method and apparatus for measuring ground impedance is described. In one embodiment, a ground impedance value is dynamically determined based on a ratio between a measured peak voltage of an electrical line of a circuit at a resistive element having a first resistance value and a measured peak voltage of the electrical line at the resistive element having a second resistance value that is smaller than the first resistance value. A high impedance value is indicated if the ratio between the measurements is below a predetermined threshold.

Figure 1:
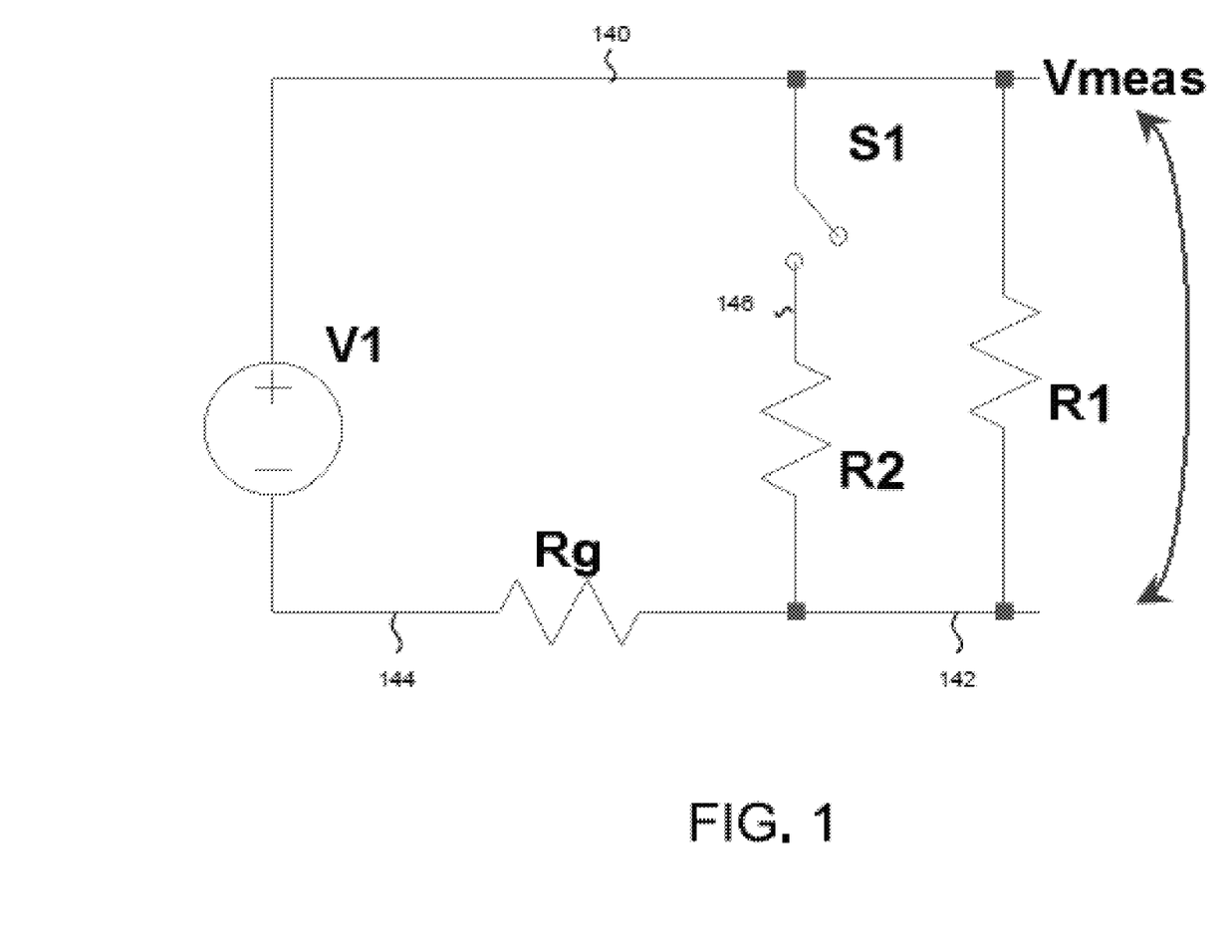
FIG. 1 illustrates an exemplary circuit schematic for measuring ground impedance according to one embodiment.

FIG. 1 illustrates an exemplary circuit schematic for measuring ground impedance according to one embodiment. The resistor R1 is connected to the node 140 that connects to the positive terminal of the voltage source V1 and to the reference node 142. The resistor R2 is connected to the switched node 146 and to the reference node 142. The switch S1, when closed, connects the resistor R2 with the node 140. When the switch S1 is closed, the resistors R1 and R2 provide resistance in the circuit in parallel. Thus, closing the switch S1 causes the resistance value of the circuit to change (the resistance value of the circuit will be smaller when the switch S1 is closed). The resistor Rg is connected to the node 144 that connects to the negative terminal of the voltage source V1 and is connected to the ground node 142. The resistance value of the resistor Rg represents the ground impedance of the circuit. Vmeas represents a voltage measurement between node 140 and node 142.

The ground impedance value of the circuit is dynamically measured based on the ratio between the voltage measurement Vmeas when the switch S1 is closed and the voltage measurement Vmeas when the switch S1 is open. The ground impedance value measurement is independent of the value of the voltage source V1. Thus, the ground impedance can be measured even when the voltage value V1 is unknown.

The voltage measurement Vmeas when the switch S1 is open (Vo) is represented by the following formula:

$$Vo = V_1 * R_1 / (R_1 + R_g) \quad \text{(formula 1)}$$

The voltage measurement Vmeas when the switch S1 is closed (Vc) is represented by the following formula:

$$Vc = V_1 * (R_1 \| R_2) / (R_1 \| R_2 + R_g) \quad \text{(formula 2)}$$

Assuming that the value of V1 is constant (at least for a short period of time), then the ground impedance (Rg) can be determined with the following formula, where Ro equals the total resistance of the circuit when the switch S1 is open and Rc equals the total resistance of the circuit when the switch S1 is closed:

$$Rg = Ro * Rc * (Vo - Vc) / (Vc * Ro - Vo * Rc) \quad \text{(formula 3)}$$

Thus, the value of the ground impedance (Rg) can be computed from the resistance values R1 and R2 and the voltage measurements when the switch S1 is closed (Vc) and when the switch S1 is open (Vo). When there is no ground impedance, the measured voltage when the switch S1 is open is the same as when the switch S1 is closed (assuming the same source voltage V1). When there is ground impedance, the measured voltage when the switch S1 is open is greater than the measured voltage when the switch S1 is closed (assuming the same voltage value of the voltage source V1).

Further, if R1 and R2 are selected such that R1<<R2, then formula 3 simplifies to:

$$\frac{V_c}{V_o} = \left[\frac{R_2}{R_1}\right]\left[\frac{R_g + R_1}{R_g + R_2}\right] \quad \text{(formula 4)}$$

Figure 2:
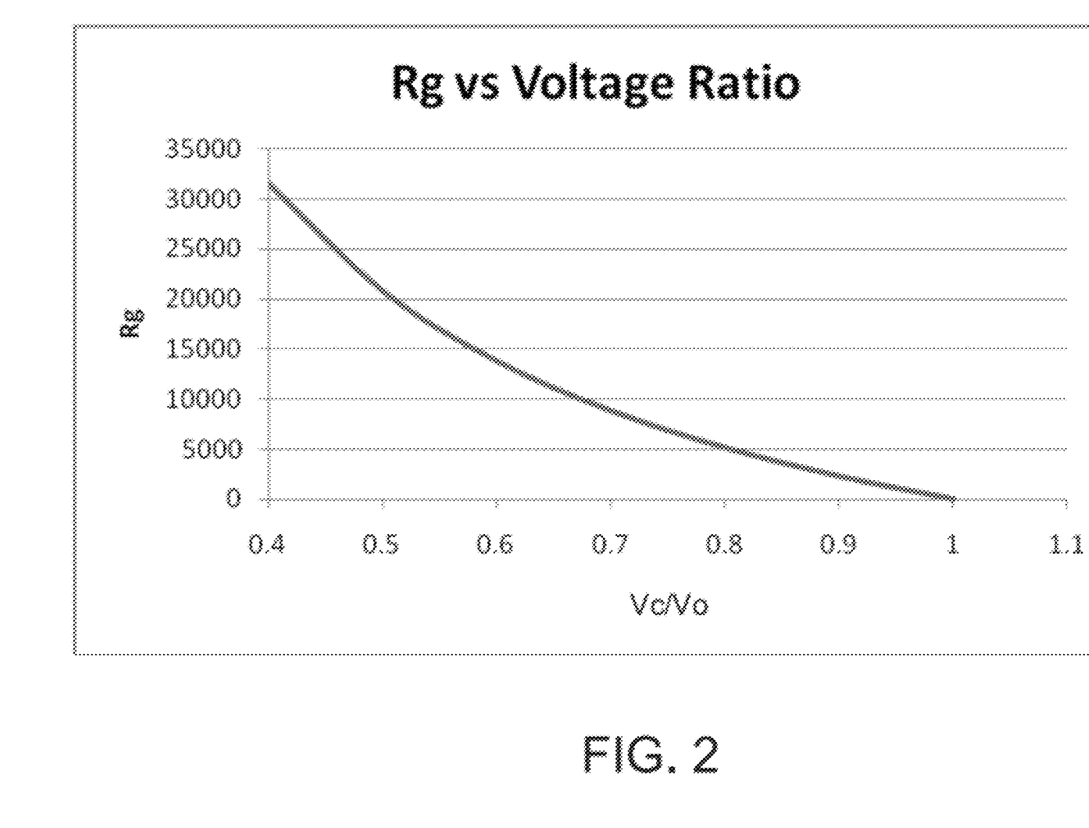
FIG. 2 is a table that illustrates the relationship between the ratio of voltage measurements in the circuit of FIG. 1 and ground impedance according to one embodiment.

FIG. 2 is a table that illustrates the relationship between the ratio between Vc/Vo and ground impedance (Rg), when the resistance value R1 is 1MΩ and the resistance value R2 is 20KΩ and assuming the same voltage value of the voltage source. As illustrated in FIG. 2, as the ratio between Vc and Vo becomes smaller, the ground impedance (Rg) becomes larger. Therefore, given known values of the resistance values R1 and R2, a threshold can be determined that indicates a high impedance ground connection.

The threshold may be set depending on the desired sensitivity of the ground impedance detection. For example, using the resistance values 1MΩ and 20KΩ for the resistors R1 and R2 respectively, if a high impedance ground connection is considered to be 10KΩ, a ratio between Vc and Vo that is below approximately 0.67 indicates a high impedance ground connection. As another example, using the same resistance values and if a high impedance ground connection is considered to be 6.8KΩ, a ratio between Vc and Vo that is below approximately 0.75 indicates a high impedance ground connection.

Figure 3:
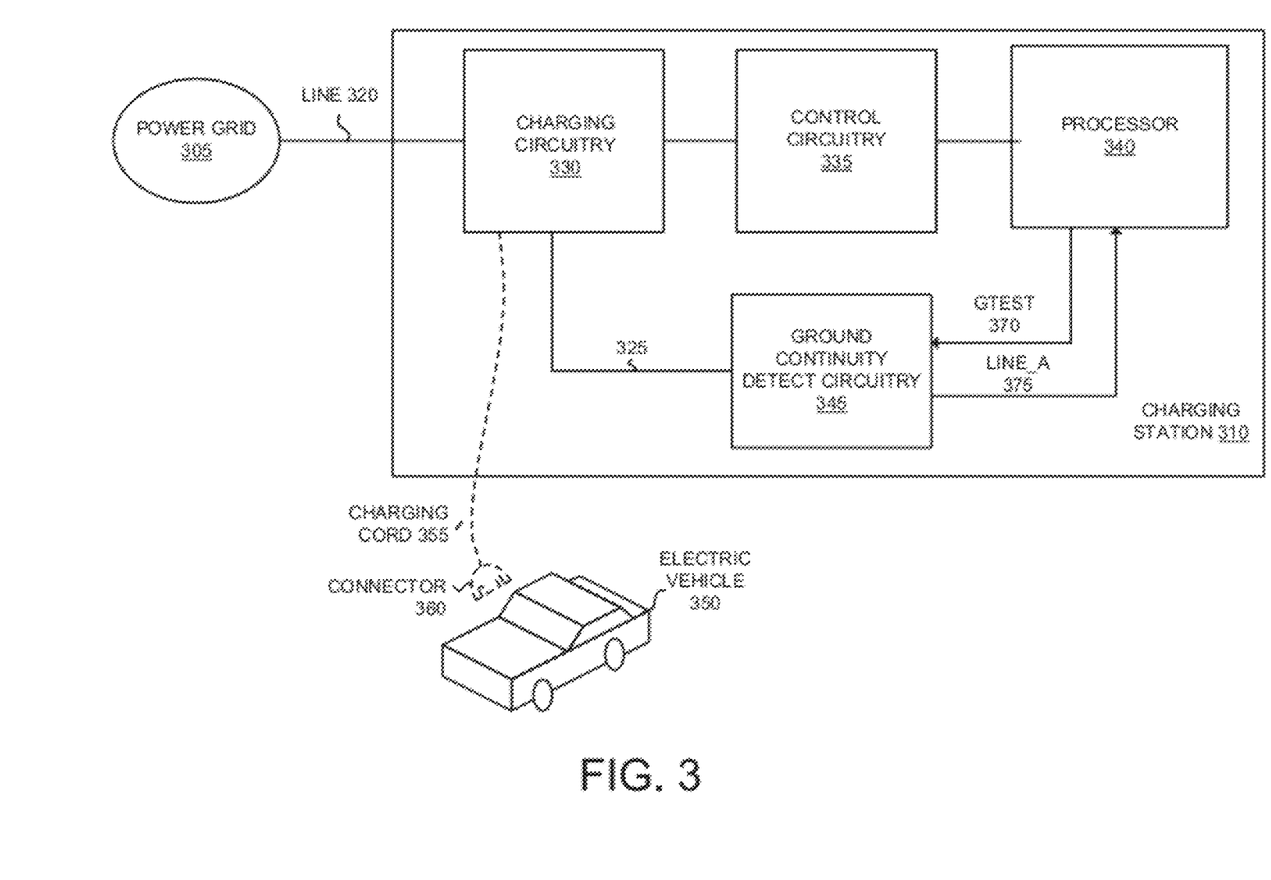
FIG. 3 illustrates an exemplary use of the ground continuity detect circuit in an electric vehicle charging system according to one embodiment.

FIG. 3 illustrates an exemplary use of the ground continuity detect circuit according to one embodiment. FIG. 3 illustrates an electric vehicle charging system for charging electric vehicles, including plug-in hybrid electric vehicles. The electric vehicle charging system includes the electric vehicle charging station 310 that is connected to the power grid 305 and is capable of charging electric vehicles such as the electric vehicle 350. By way of example, an operator of the electric vehicle 350 establishes a connection between the vehicle and the charging station 310 (e.g., by connecting the connector 360 of the charging cord 355 to onboard charging circuitry of the electric vehicle 350) in order to charge the vehicle 350.

The charging station 310 includes the processor 340 (e.g., PIC (Programmable Interface Controller) processor), control circuitry 335, charging circuitry 330, and ground continuity detect circuitry 345. The architecture of the charging station 310 illustrated in FIG. 3 is exemplary and other alternative architectures may be used with the embodiments of the invention described herein. In addition, the charging station 310 may include other components such as transceiver(s), storage device(s), other processor(s), etc., that are not illustrated in FIG. 3 in order not to obscure understanding of the invention.

The charging circuitry 330 includes circuitry for coupling the power grid 305 with an electric vehicle for charging that electric vehicle. The charging circuitry 330 can be energized or de-energized to allow or prevent energy from being transferred between an electric vehicle and the power grid 305. For example, the charging circuitry 330 may include a relay or switch that closes a set of contacts when energized to allow current to flow between the power grid 305 and an electric vehicle and open the set of contacts when de-energized to prevent current from flowing between the power grid 305 and the electric vehicle.

In one embodiment, the charging circuitry 330 is controlled by the control circuitry 335 and the processor 340. For example, the processor 340 may drive a signal to the control circuitry 335 causing the control circuitry 335 to generate current output to energize the charging circuitry 335 and cause the set of contacts to close.

Figure 4:
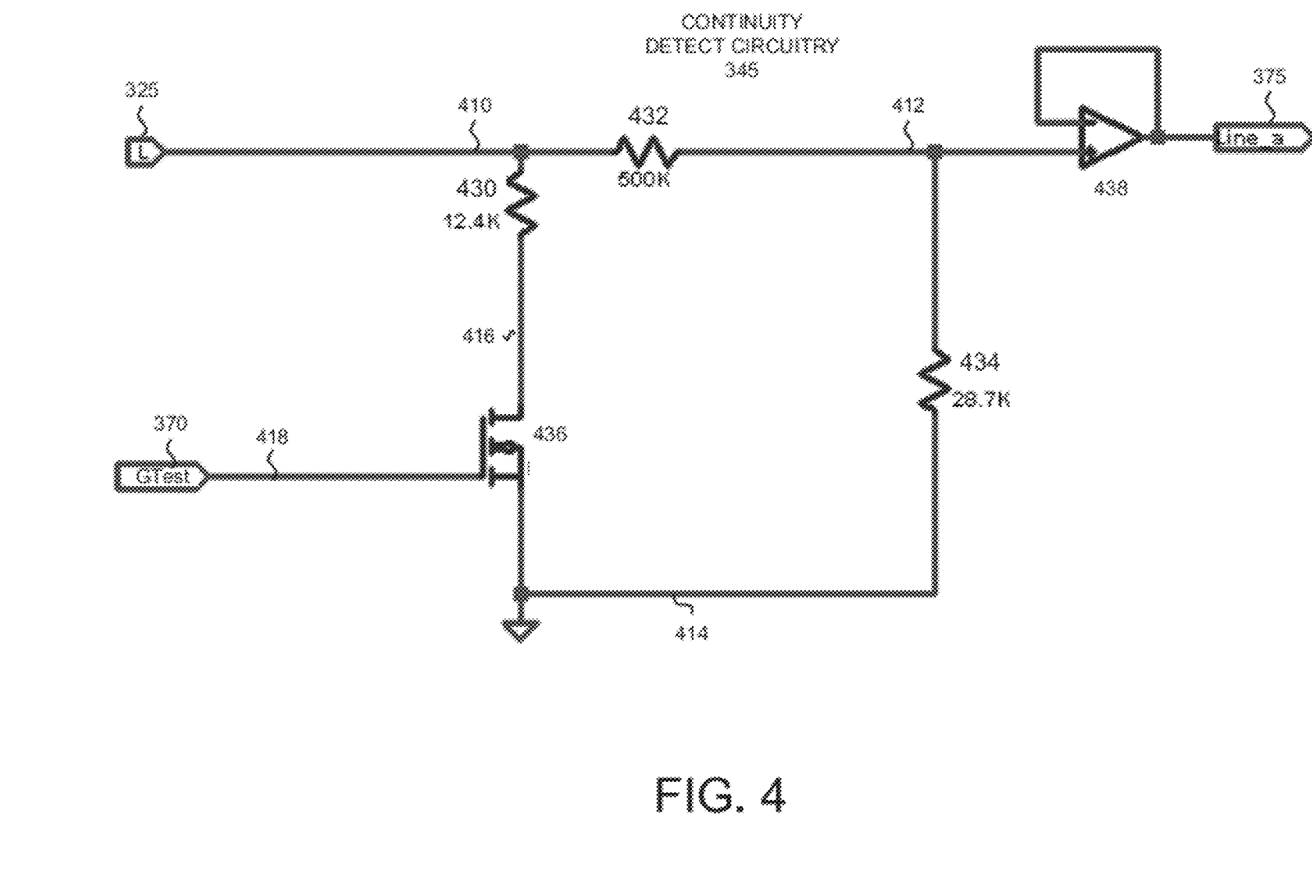
FIG. 4 illustrates an exemplary circuit schematic of a ground continuity detect circuit according to one embodiment.

The ground continuity detect circuitry 345 is used for dynamically measuring the ground impedance of the charging station 310 to determine ground continuity. FIG. 4 illustrates an exemplary circuit schematic of the ground continuity detect circuitry 345 according to one embodiment. The electrical line 325 represents an electrical line input to the charging station (e.g., an AC line input). With reference to FIG. 1, the resistor 430 corresponds to the resistor R2 and the resistors 432 and 434 correspond to the resistor R1 (the resistors 432 and 434 form a voltage divider that limits the voltage seen by the rest of the circuit). The MOSFET transistor 436 performs the switching function of the switch S1. For example, when asserted on the gate node 418, the voltage of the GTest (ground continuity test) signal 370 applied to the gate of the transistor 436 causes a channel to be created between the source and drain of the transistor 436 through which current can pass. In one embodiment, the processor 340 periodically (e.g., every 10 cycles in an AC configuration) asserts the GTest signal 370 for an entire cycle.

Therefore, according to one embodiment, asserting the GTest signal 370 to the transistor 436 causes the switched node 416 to be connected to the ground node 414. As a result, asserting the GTest signal 370 causes the resistance value of the circuit to change (the resistance value of the circuit will be smaller when the GTest signal 370 is asserted).

If there is no ground impedance in the circuit, a voltage measurement with respect to the line_a signal 375 associated with the electrical line input 325 that is output by the op-amp 438 will be the same when the GTest signal 370 is asserted and not asserted. If there is ground impedance in the circuit, the voltage measurement with respect to the line_a signal 375 will be smaller when the GTest signal is asserted as compared when the GTest signal 370 is not asserted.

In one embodiment, the processor 340 dynamically determines the ground impedance value based on the ratio between the voltage measurement of the circuit when the switching mechanism is closed and the voltage measurement of the circuit when the switching mechanism is open. The ground impedance value is independent of the value of the voltage source (thus the value of the voltage source may be unknown and may vary). For example, in an AC configuration, the processor 340 monitors and records the peak voltage of the waveform of the line_a signal 375 associated with the electrical line input 325 that is output by the op-amp 438. The processor 340 determines an impedance value of the grounding path of the circuit based on a ratio between the peak voltage value of the line_a signal 375 when the GTest signal 370 is asserted and the peak voltage value of the line_a signal 375 when the GTest signal 370 is asserted.

Although the ground impedance measurement is independent of the value of the voltage source, the voltage source value needs to be constant between the voltage measurements in order to have an accurate ground impedance measurement. In one embodiment, in an AC configuration, the processor 340 compares the voltage measured on the line_a signal 375 when the GTest signal 370 is asserted with the voltage measured on the line_a signal 375 during the previous cycle, in order to have the most accurate ground impedance measurement.

In one embodiment, in conditions where there is high ground impedance (e.g., the ratio between voltage measurements is below a predetermined threshold), the charging circuitry is prevented from becoming energized and/or is de-energized when there is a high ground impedance that occurs during operation (e.g., while charging an electric vehicle). For example, responsive to determining that there is high ground impedance, the processor 340 may cause the control circuitry 335 to either de-energize the charging circuitry 335 (if energized) or prevent the charging circuitry 335 from becoming energized.

Other actions may also be taken in conditions responsive to determining that there is high ground impedance in some embodiments. For example, a notification message (e.g., email, text message, etc.) that indicates a high ground impedance value may be automatically generated and transmitted to one or more interested parties (e.g., the charging station owner, the charging station manufacturer, the charging station servicer, the electric vehicle operator that was using the charging station that is experiencing high ground impedance). As another example, the high ground impedance condition may be logged. As yet another example, light(s) on the charging station may illuminate that indicate the high ground impedance and/or a display on the charging station may indicate the high ground impedance.

Figure 5:
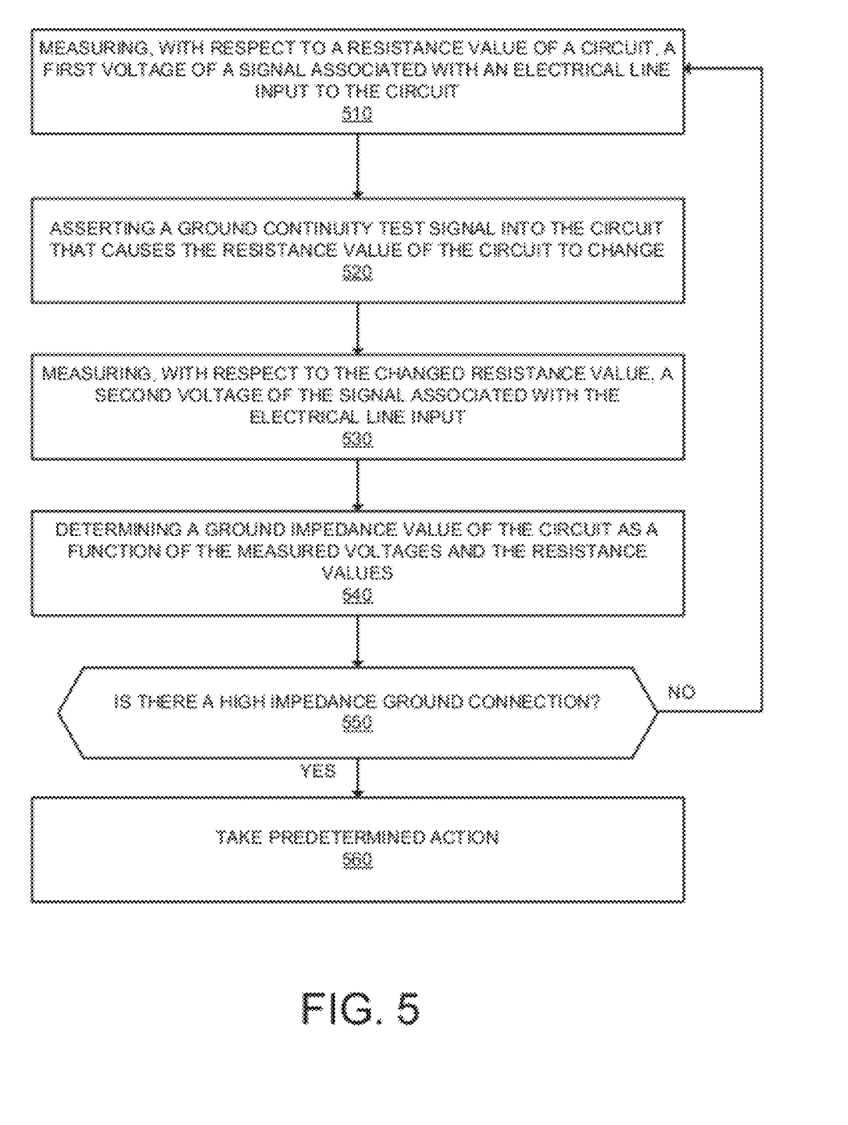
FIG. 5 is a flow diagram illustrating exemplary operations for measuring ground impedance according to one embodiment.

FIG. 5 is a flow diagram illustrating exemplary operations for measuring ground impedance according to one embodiment. The operations of FIG. 5 will be described with reference to the exemplary embodiment of FIGS. 3 and 4. However, it should be understood that the operations of FIG. 5 can be performed by embodiments other than those discussed with reference to FIGS. 3 and 4, and the embodiments discussed with reference to FIGS. 3 and 4 can perform operations different than those discussed with reference to FIG. 5.

At operation 510, a processor 340 measures, with respect to a resistance value of a circuit, a first voltage of a signal associated with an electrical line input (e.g., AC line input or DC line input) to the circuit. As a specific example where the electrical line input is an AC line input, the processor 340 measures the peak voltage of the signal during a first cycle. With reference to FIG. 4, the processor 340 measures the voltage of the line_a signal when the GTest signal 370 is not asserted (and thus the switching function provided by the MOSFET transistor 436 is equivalent to an open switch). Flow then moves to operation 520.

At operation 520, the processor 340 asserts a ground continuity test signal (e.g., GTest signal 370) into the circuit that causes the resistance value of the circuit to change. With respect to FIG. 4, the GTest signal 370 essentially causes the switching function provided by the MOSFET transistor 436 to be in a closed state, which causes the resistance value of the circuit to change (the changed resistance value of the circuit is smaller). Flow then moves to operation 530.

At operation 530, the processor 340, measures, with respect to the changed resistance value of the circuit, a second voltage of the signal associated with the electrical line input to the circuit. As a specific example where the electrical line input is an AC line input, the processor 340 measures the peak voltage of the signal during a second cycle. Flow then moves to operation 540.

At operation 540, the processor 340 determines a ground impedance value of the circuit as a function of the measured voltages and the resistance values of the circuit. For example, the ground impedance value is determined by a ratio between the second voltage measured at the changed resistance value and the first voltage measured at the original resistance value (without the ground continuity test signal asserted). If there is ground impedance in the circuit, the measured second voltage will be less than the measured first voltage. Flow then moves to operation 550.

At operation 550, the processor 340 determines whether the ground impedance value is a high ground impedance value. For example, the processor 340 compares the ratio with a predetermined threshold to determine whether the ground impedance value is a high ground impedance value. If the ground impedance value is a high ground impedance value, then flow moves to operation 560, otherwise flow moves back to operation 510.

At operation 560, the processor 340 takes one or more predetermined actions as a result of the high ground impedance condition. In one embodiment, in an electric vehicle charging system, responsive to determining that there is a high ground impedance, the processor 340 causes the charging circuitry from becoming energized (if not presently energized) or causes the charging circuitry to be de-energized (if presently energized).

In one embodiment, in an electric vehicle charging system, upon determining that there is high ground impedance, the charging circuitry is prevented from being energized until the electric vehicle is disconnected from the electric vehicle charging station. In other embodiments, the charging circuitry is prevented from being energized until a servicer of the charging station determines that the charging station is safe to use.

The ground continuity detect circuit described herein is capable of measuring ground impedance as low as 1KΩ, and is independent of the value of the source voltage. In addition, the ground continuity detect circuit described herein does not require custom wound transformers and is able to use standard off-the shelf components.

Figure 6:
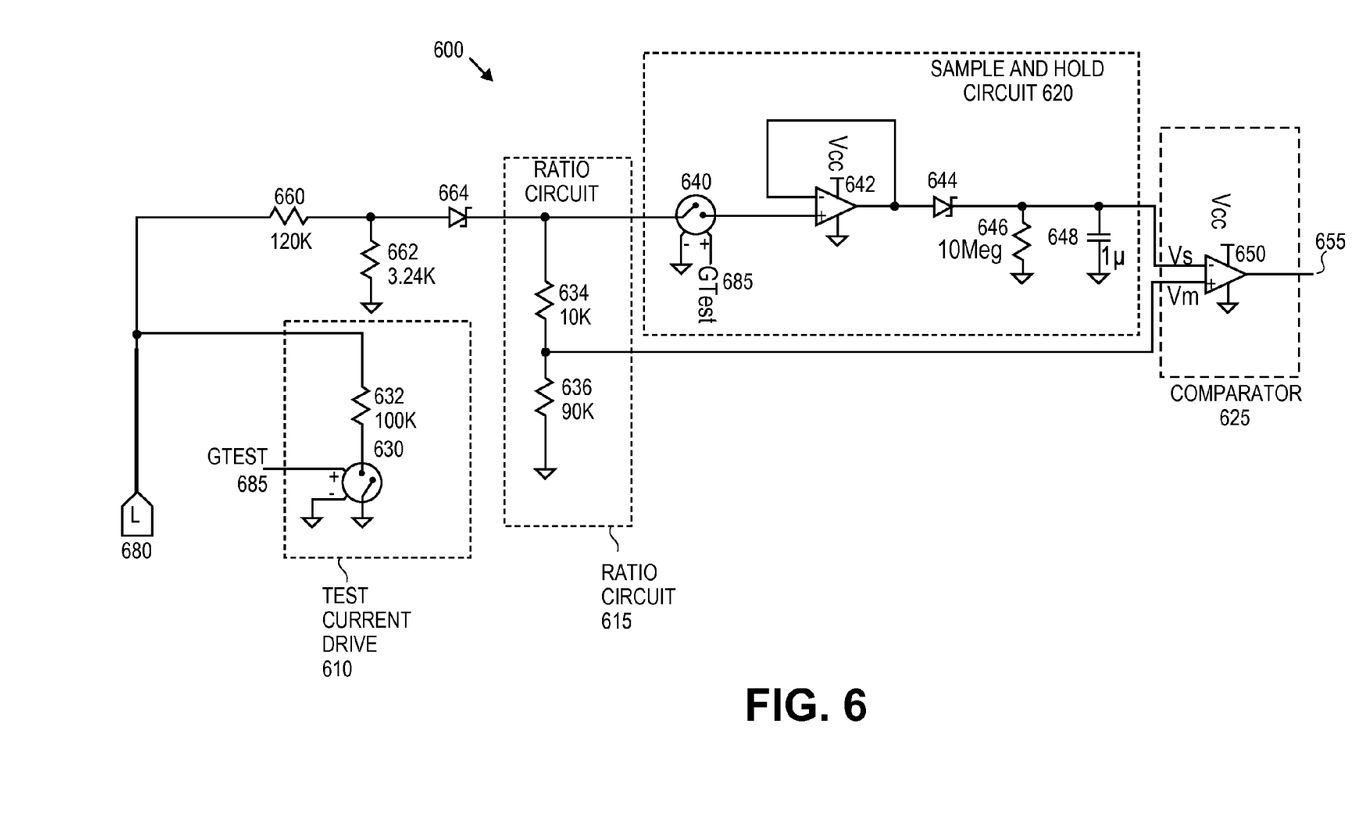
FIG. 6 illustrates an exemplary circuit schematic of a ground continuity detect circuit according to another embodiment.

FIG. 6 illustrates an exemplary circuit schematic of a ground continuity detect circuit according to another embodiment. The circuit 600 includes four main elements, the test current drive 610, the ratio circuit 615, the sample and hold circuit 620, and the comparator 625. In addition, the circuit 600 includes the electrical line input 680, the resistors 660 and 662, and the diode 664.

The test current drive 610 includes a switching mechanism 630 and a resistor 632. The switching mechanism can be implemented with a MOSFET transistor, a bi-polar transistor, or other suitable switch.

The ratio circuit 615 includes the resistors 634 and 636. The ratio circuit 615 reduces the input voltage seen by the comparator 625. The ratio between the resistance values of the resistors 634 and 636 is chosen depending on the desired sensitivity of the ground impedance detection. It should be understood that while two resistors are illustrated, the number of resistors is illustrative as there may be more resistors in some embodiments (e.g., a set of one or more resistors that logically correspond to the function of resistor 634 and a set of one or more resistors that logically correspond to the function of resistor 636).

The sample and hold circuit 620 includes the switching mechanism 640 (e.g., a MOSFET transistor, a bi-polar transistor, or other suitable switch), the op-amp 642, the diode 644, the resistor 646 and the capacitor 648. When the switching mechanism 640 is closed, the sample and hold circuit 620 senses the voltage at its input and measure and stores its maximum value. For example, the op-amp 642 samples the voltage and its maximum value is stored in the capacitor 648.

The comparator 650 compares the voltage retained by the sample and hold circuit 620 with the input voltage reduced by the ratio circuit 615. If the input voltage reduced by the ratio 615 exceeds the voltage reduced by the ratio circuit 615, the comparator 650 switches state thereby indicating a fault condition.

In one embodiment, a ground continuity test signal 685 is asserted into the switching mechanism 630 and the switching mechanism 640. The ground continuity test signal 685 causes the switching mechanism 630 to close thereby lowering the resistance value of the circuit 600. The ground continuity test signal 685 also causes the switching mechanism 630 to close thereby activating the sample and hold circuit 620. In one embodiment, the ground continuity test signal 685 is asserted by a processor (e.g., a PIC processor) while in other embodiments it is outputted through a sequential circuit.

In one embodiment, in subsequent AC cycles, the comparator 650 compares its input voltage (reduced by the ratio circuit 615) to the voltage retained by the sample and hold circuit 620. If the input voltage reduced by the ratio 615 exceeds the voltage reduced by the ratio circuit 615, the comparator 650 switches state thereby indicating a fault condition. Based on the signal 655, the processor determines whether there is ground impedance.

Figure 7:
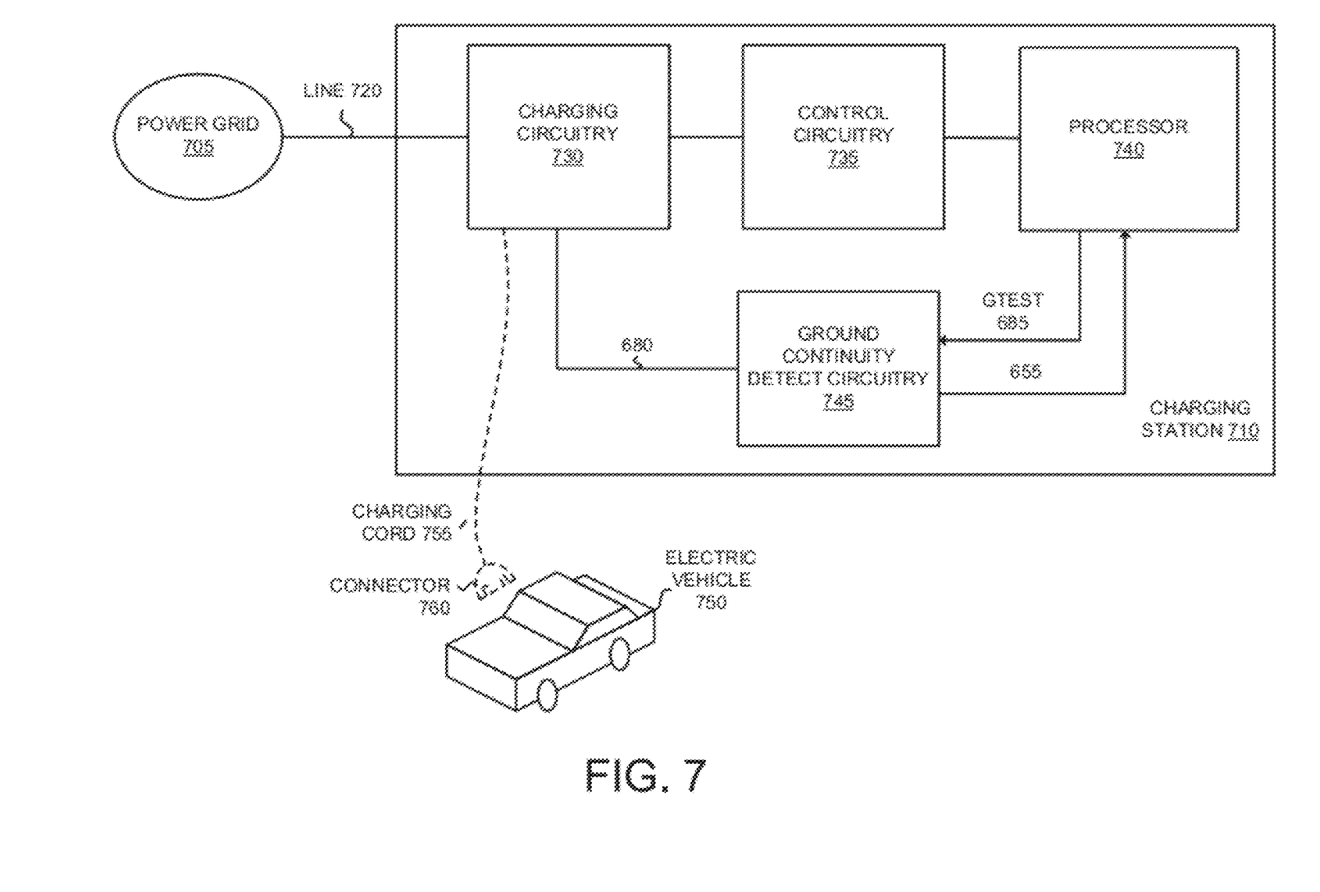
FIG. 7 illustrates an exemplary use of the ground continuity detect circuit of FIG. 6 according to one embodiment.

FIG. 7 illustrates an exemplary use of the ground continuity detect circuit of FIG. 6 according to one embodiment. The electric vehicle charging system illustrated in FIG. 7 is similar to the electric vehicle charging system illustrated in FIG. 3. For example, the electric vehicle charging system illustrated in FIG. 7 includes the electric vehicle charging station 710 that is connected to the power grid 705 and is capable of charging electric vehicles such as the electric vehicle 750. By way of example, an operator of the electric vehicle 750 establishes a connection between the vehicle and the charging station 710 (e.g., by connecting the connector 760 of the charging cord 755 to onboard charging circuitry of the electric vehicle 750) in order to charge the vehicle 750.

The charging station 710 includes the processor 740 (e.g., PIC (Programmable Interface Controller) processor), control circuitry 735, charging circuitry 730, and ground continuity detect circuitry 745. The architecture of the charging station 710 illustrated in FIG. 7 is exemplary and other alternative architectures may be used with the embodiments of the invention described herein. In addition, the charging station 710 may include other components such as transceiver(s), storage device(s), other processor(s), etc., that are not illustrated in FIG. 3 in order not to obscure understanding of the invention.

The charging circuitry 730 and the control circuitry 735 are similar to the charging circuitry 330 and the control circuitry 335 respectively. The ground continuity detect circuitry 745 corresponds to the exemplary circuit schematic illustrated in FIG. 6. The ground continuity detect circuitry 745 is used to detect ground impedance of the charging station 710. The processor 740 periodically (e.g., every 10 cycles in an AC configuration) asserts the ground continuity test signal 685 into the ground continuity detect circuitry 745. With reference to FIG. 6, assertion of the ground continuity test signal 685 lowers the resistance of the circuit and enables a sample and hold circuit.

The processor 740 analyzes the voltage on the output 655 of the comparator to determine whether a ground impedance error condition exists. If a ground impedance error condition exists, the processor 740 takes one or more predetermined actions. In one embodiment, in an electric vehicle charging system, responsive to determining that there is a high ground impedance, the processor 740 causes the charging circuitry 730 from becoming energized (if not presently energized) or causes the charging circuitry 730 to be de-energized (if presently energized). In one embodiment, in an electric vehicle charging system, upon determining that there is high ground impedance, the charging circuitry 730 is prevented from being energized until the electric vehicle is disconnected from the electric vehicle charging station. In other embodiments, the charging circuitry 730 is prevented from being energized until a servicer of the charging station determines that the charging station is safe to use.

While FIG. 7 illustrates a processor that asserts the ground continuity test signal and analyzing the voltage of the output of a comparator to determine whether a ground impedance condition exists, in other embodiments a sequential circuit included in the charging station asserts the ground continuity test signal and/or a circuit analyzes the voltage of the output of the comparator to determine whether a ground impedance error condition exists.

Figure 8:
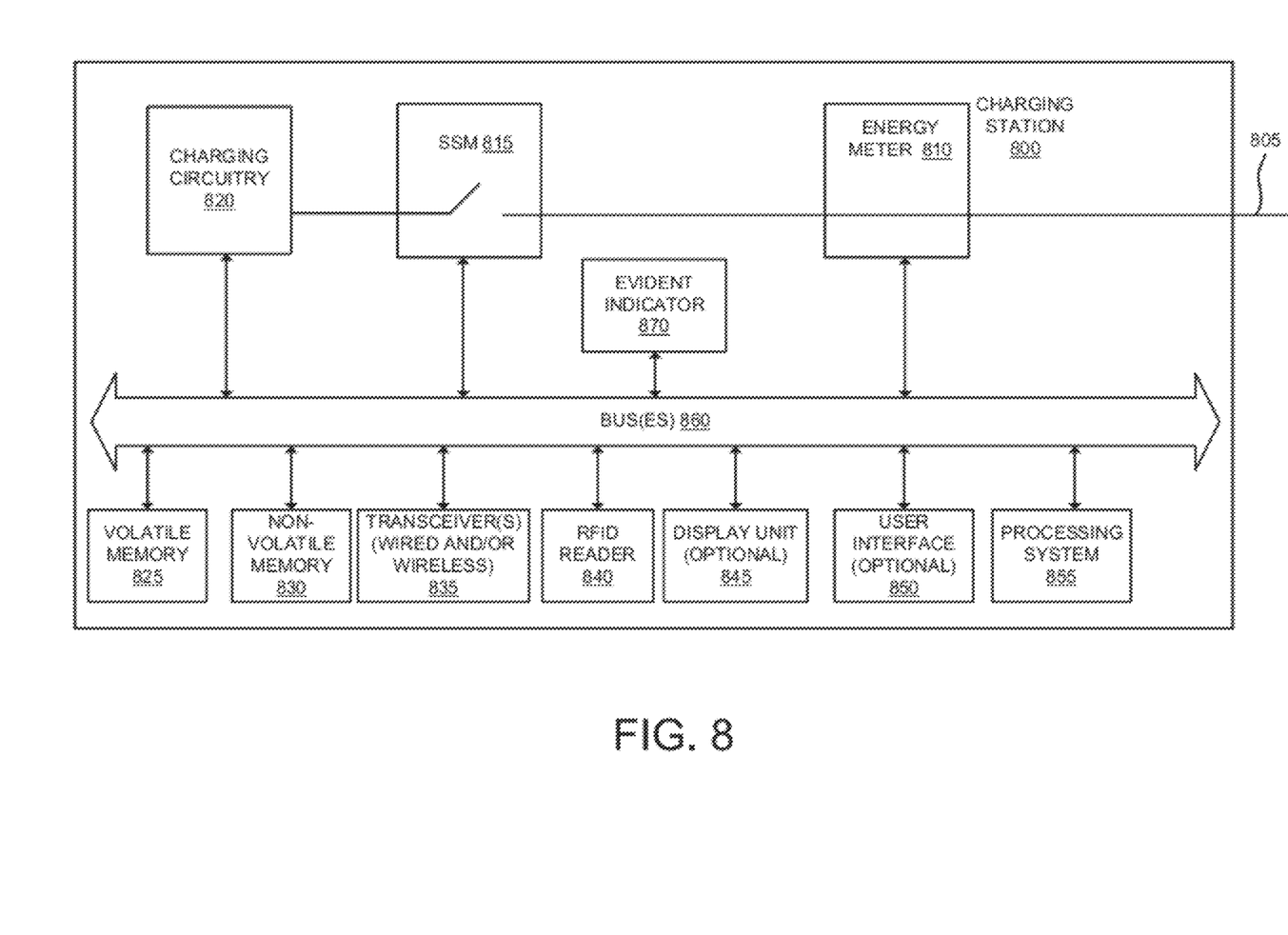
FIG. 8 illustrates an exemplary embodiment of an electric vehicle charging station used in embodiments.

FIG. 8 illustrates an exemplary embodiment of a charging station according to one embodiment of the invention. It should be understood that FIG. 8 illustrates an exemplary architecture of a charging station, and other, different architectures may be used in embodiments of the invention described herein. As illustrated in FIG. 8, the charging station 800 includes the energy meter 810, the SSM (Safety Supervisory Module) 820, the charging circuitry 820, the volatile memory 825, the non-volatile memory 830 (e.g., hard drive, flash, PCM, etc.), one or more transceiver(s) 835 (e.g., wired transceiver(s) (e.g., Ethernet, power line communication (PLC), etc.) and/or wireless transceiver(s) (e.g., 802.15.4 (e.g., ZigBee, etc.), Bluetooth, WiFi, Infrared, GPRS/GSM, CDMA, etc.)), the RFID reader 840, the display unit 845, the user interface 850, and the processing system 855 (e.g., one or more microprocessors and/or a system on an integrated circuit), which are coupled with one or more buses 860.

The energy meter 810 measures the amount of electricity that is flowing on the power line 805 through the charging circuitry 820. While in one embodiment of the invention the energy meter 810 measures current flow, in an alternative embodiment of the invention the energy meter 810 measures power draw. The energy meter 810 may be an induction coil or other devices suitable for measuring electricity. In some embodiments, the energy meter 810 is a programmable time of use energy meter.

The charging circuitry 820 includes circuitry for a power receptacle (e.g., for level one charging) and/or circuitry for an attached charging cord (e.g., for level two charging) (e.g., with a SAE J1772 connector). The power receptacle can be any number of types of receptacles such as receptacles conforming to the NEMA (National Electrical Manufacturers Association) standards 5-15, 5-20, and 14-50 or other standards (e.g., BS 1363, CEE7, etc.) and may be operating at different voltages (e.g., 120V, 240V, 230V, etc.).

The SSM 815 includes a ground continuity detect circuit (e.g., similar to the ground continuity detect circuitry 345 or the ground continuity detect circuitry 745), control circuitry (e.g., similar to the control circuitry 335 or the control circuitry 735), and one or more processors (e.g., similar to the processor 340 or the processor 740). The SSM 815 may also include other circuitry such as a charge circuit interrupting device (CCID) that monitors the differential current among the current-carrying conductors and interrupts the circuit when the differential current exceeds a specified nominal value. The SSM 815 is capable of de-energizing the charging circuitry 820 upon determining a high ground impedance connection exists as described herein.

The RFID reader 840 reads RFID tags from RFID enabled devices (e.g., smartcards, key fobs, contactless credit cards, etc.), embedded with RFID tag(s) of operators that want to use the charging station 800. For example, in some embodiments a vehicle operator can wave/swipe an RFID enabled device near the RFID reader 830 to request charging service with the charging station 800. It should be understood, however, that charging sessions may be requested in different ways and access identifiers may be presented to the charging station in different ways. For example, in some embodiments the electric vehicles communicate an access identifier (e.g., their VIN) to the charging station through a protocol (e.g., PLC). In such embodiments, the electric vehicle operator may not be required to present an access identifier (such as the RFID enabled device) to gain access to the charging station. However, it should be understood that the electric vehicle operators may use the RFID reader 840 for payment.

The transceiver(s) 835 transmit and receive messages. For example, the transceiver(s) 835 may transmit authorization requests to a charging station network server for authorization (and receive corresponding authorization replies), transmit charging session data to the server for accounting, etc. The transceiver(s) 835 may also transmit messages to interested parties to indicate a high ground impedance.

The display unit 845 is used to display messages to vehicle operators including the price(s) for charging service, current cost for charging service, charging status, confirmation messages, error messages, high ground impedance, notification messages, etc. The display unit 845 may also display parking information if the charging station 800 is also acting as a parking meter (e.g., amount of time remaining in minutes, parking violation, etc.).

The user interface 840 allows users to interact with the charging station 800. By way of example, the user interface 850 allows electric vehicle operators to request charging sessions, pay for charging sessions, enter in account and/or payment information, etc. In one embodiment, the evident indicator 870 illuminates when a high ground impedance condition is detected. The processing system 855 may retrieve instruction(s) from the volatile memory 825 and/or the nonvolatile memory 830, and execute the instructions to perform operations.

Some portions of the present invention may be implemented using code and data stored and executed on the charging station. The code and/or data may be stored in machine-readable media, such as machine-readable storage media (e.g., magnetic disks; optical disks; random access memory; read only memory; flash memory devices; phase-change memory) and/or machine-readable communication media (e.g., electrical, optical, acoustical or other form of propagated signals—such as carrier waves, infrared signals, digital signals, etc.). Thus, the storage device(s) of a given charging station typically stores code and/or data for execution on a set of one or more processors of that charging station. Of course, one or more parts of an embodiment of the invention may be implemented using different combinations of software, firmware, and/or hardware.

While embodiments of the invention have been described in relation to an electric vehicle charging station, the ground continuity circuit described herein may be used in different applications and systems. For example, the ground continuity circuit described herein may be used in any appliances plugged into a power supply (e.g., dryer, stove, washing machine, refrigerator, etc.).

While the flow diagrams in the figures show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A method, comprising:
measuring, with respect to a first resistance value of a circuit, a first voltage of a signal associated with an electrical line input to the circuit, wherein a first set of one or more resistors provides the first resistance value of the circuit;
asserting a ground continuity test signal into the circuit that causes a switch to close to change the resistance value of the circuit to a second resistance value by causing a second set of one or more resistors to be connected in parallel with the first set of resistors, wherein the second resistance value is lower than the first resistance value;
measuring, with respect to the second resistance value, a second voltage of the signal associated with the electrical line input; and
determining a ground impedance value of the circuit as a function of the first and second measured voltages and the first and second resistance values.

2. The method of claim 1, wherein the ground impedance value is determined by a ratio between the measured second voltage and the measured first voltage.

3. The method of claim 2, wherein the ratio being below a predetermined threshold indicates a high impedance of the grounding path.

4. The method of claim 3, further comprising:
wherein the circuit is part of an electric vehicle charging system; and
preventing charging circuitry of the electric vehicle charging system from being energized when the ratio indicates high impedance of the grounding path.

5. The method of claim 3, further comprising:
wherein the circuit is part of an electric vehicle charging system; and
interrupting charging circuitry of the electric vehicle charging system when the ratio indicates high impedance of the grounding path during charging operation.

6. An apparatus, comprising:
a first set of one or more resistors providing resistance to a circuit;
a second set of one or more resistors connected in parallel with the first set of resistors by a switching mechanism, wherein the second set of resistors provides resistance to the circuit when the switching mechanism is closed and not when the switching mechanism is open; and
a processor operable to:
periodically assert a ground continuity test signal into the circuit for operating the switching mechanism, and
determine a ground impedance value of the circuit based on a ratio between a first voltage measurement of the circuit when the switching mechanism is closed and a second voltage measurement of the circuit when the switching mechanism is open.

7. The apparatus of claim 6, wherein the ground impedance value is high impedance when the ratio is below a predetermined threshold.

8. The apparatus of claim 7, further comprising:
charging circuitry connected to a load terminal for charging electric vehicles;
control circuitry for energizing and de-energizing the charging circuitry;
wherein the processor is further operable to prevent the charging circuitry from being energized when the ratio is below the predetermined threshold.

9. The apparatus of claim 7, further comprising:
charging circuitry connected to a load terminal for charging electric vehicles;
control circuitry for energizing and de-energizing the charging circuitry;
wherein the processor is further operable to cause the control circuitry to de-energize the charging circuitry when the ratio is below the predetermined threshold.

10. The apparatus of claim 6, wherein the switching mechanism includes a transistor.

11. An apparatus, comprising:
a means for measuring, with respect to a first resistance value of a circuit, a first voltage of a signal associated with an electrical line input to the circuit, wherein a first set of one or more resistors provides the first resistance value of the circuit;
a means for asserting a ground continuity test signal into the circuit that causes a switch to close to change the resistance value of the circuit to a second resistance value by causing a second set of one or more resistors to be connected in parallel with the first set of resistors, wherein the second resistance value is lower than the first resistance value;
a means for measuring, with respect to the second resistance value, a second voltage of the signal associated with the electrical line input; and
a means for determining a ground impedance value of the circuit as a function of the first and second measured voltages and the first and second resistance values.

12. The apparatus of claim 11, wherein the ground impedance value is determined by a ratio between the measured second peak voltage and the measured first peak voltage.

13. The apparatus of claim 12, wherein the ratio being below a predetermined threshold indicates a high impedance of the grounding path.

14. The apparatus of claim 13, further comprising:
wherein the circuit is part of an electric vehicle charging system; and
a means for preventing charging circuitry of the electric vehicle charging system from being energized when the ratio indicates high impedance of the grounding path.

15. The apparatus of claim 13, further comprising:
wherein the circuit is part of an electric vehicle charging system; and
a means for interrupting charging circuitry of the electric vehicle charging system when the ratio indicates high impedance of the grounding path during charging operation.

* * * * *